United States Patent
Alam et al.

(10) Patent No.: US 9,336,849 B2
(45) Date of Patent: May 10, 2016

(54) MEMORY DEVICE WITH SHARED READ/WRITE CIRCUITRY

(71) Applicant: Everspin Technologies, Inc., Chandker, AZ (US)

(72) Inventors: Syed M. Alam, Austin, TX (US); Chitra K. Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/727,981

(22) Filed: Jun. 2, 2015

(65) Prior Publication Data

US 2016/0099038 A1 Apr. 7, 2016

Related U.S. Application Data

(60) Provisional application No. 62/058,543, filed on Oct. 1, 2014.

(51) Int. Cl.
*G11C 11/00* (2006.01)
*G11C 11/16* (2006.01)

(52) U.S. Cl.
CPC .......... *G11C 11/1675* (2013.01); *G11C 11/161* (2013.01)

(58) Field of Classification Search
CPC .......................... G11C 11/1675; G11C 11/161
USPC .................. 365/158, 189.15, 189.16, 189.011
See application file for complete search history.

(56) References Cited

U.S. PATENT DOCUMENTS

2013/0128658 A1* 5/2013 Alam ................. G11C 11/1675
365/158

* cited by examiner

*Primary Examiner* — Vu Le
(74) *Attorney, Agent, or Firm* — Lee & Hayes, PLLC

(57) ABSTRACT

In some examples, a memory device may be configured to read or write multiple bit cells as part of the same operation. In some cases, the tunnel junctions forming the bit cells may be arranged to utilize shared read/write circuitry. For instance, the tunnel junctions may be arranged such that both tunnel junctions may be written using the same write voltages. In some cases, the bit cells may be configured such that each bit cell is driven to the same state, while in other cases, select bit cells may be driven high, while others are driven low.

20 Claims, 7 Drawing Sheets

MEMORY DEVICE WITH SHARED READ/WRITE CIRCUITRY

RELATED APPLICATION

This application claims priority to U.S. Provisional Application No. 62/058,543 to Alam et al., entitled "Memory Device with Reduced Read/Write Circuitry," filed Oct. 1, 2014, the contents of which are incorporated herein by reference in their entirety.

BACKGROUND

In the electronic industry of today there is a constant drive to reduce the size of electronic devices, increase battery life, and improve performance. In some cases, reducing the size, increasing the battery life, and improving performance of the electronic device is related to reducing the size and power consumption of individual components of the electronic device, such as the memory device. For example, in memory device architectures, such as dynamic random access memories (DRAM) devices and magnetic random access memories (MRAM), there is a consistent effort to increase memory storage density and access speeds, while reducing overall power consumption and leakage.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
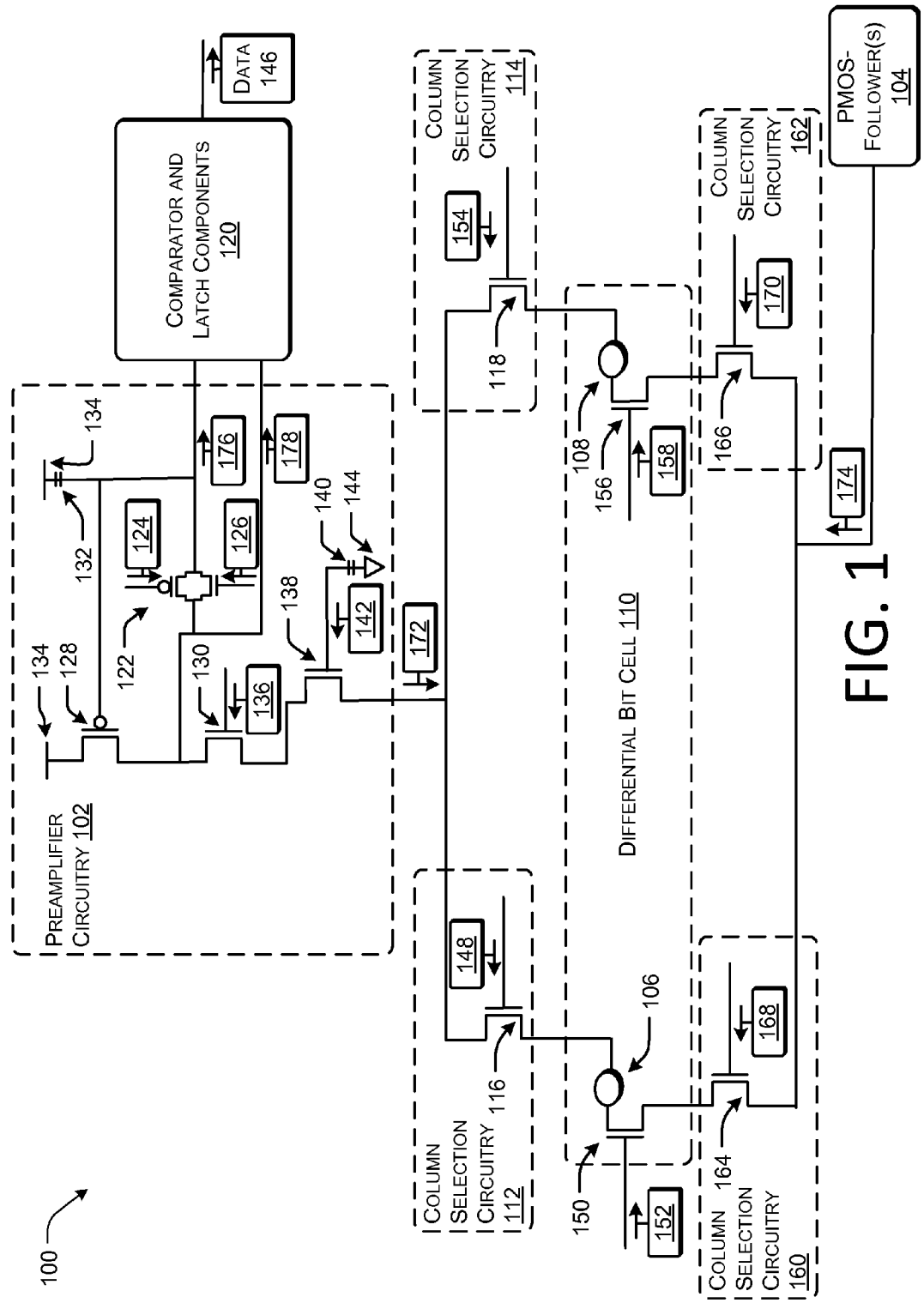
FIG. 1 illustrates a diagram of an example memory device incorporating shared read circuitry according to some implementations.

This disclosure includes techniques and implementations to reduce the overall size and number of components associated with memory devices, such as magnetic random access memories (MRAMs) devices, while maintaining similar storage capacities and power consumption levels. In some cases, reducing the size of the memory device may be achieved by reducing the number of circuits or components utilized to read and write bit cells of the memory device. For example, in some implementations, memory devices may be configured to utilize pairs of tunnel junctions (or magnetic tunnel junctions), as differential bit cells. In these implementations, a state associated with each tunnel junction associated with a bit cell may be compared to each other each time the bit cell is accessed. However, when different preamplifiers (or sense amplifiers) are utilized to determine a state associated with each the tunnel junctions, some degree of device mismatch occurs. Typically, the device mismatch may be overcome by increasing the area of transistors of the preamplifiers, which in turn results in utilizing larger sense amplifiers and increased power consumption over non-differential bit cell memory devices.

In some implementations, a memory device having differential bit cells that utilize shared read/write circuitry are described herein. In some examples, the differential bit cells may be configured to share positive-channel metal oxide semiconductor (PMOS)-follower circuitry, negative-channel metal oxide semiconductor (NMOS)-follower circuitry, and/or sense amplifier circuitry. For instance, by configuring the differential bit cells to utilize a shared preamplifier circuit, the device mismatch caused by having different preamplifiers may be reduced or eliminated, allowing the memory device to be manufactured with smaller preamplifiers. Having fewer and smaller preamplifiers in the memory device reduces both the overall device size and the overall power consumption.

In one example, a memory device may include a first memory array arranged adjacent to a second memory array. In this particular example, the first memory array may have column selection circuitry configured below the first memory array and the second memory array may have column selection circuitry configured above the second memory array. In this manner, common read circuitry may be coupled between the column selection circuitry of both the first and second memory arrays and, thus, configured to drive the lines, such as bit line or source line, of both the first memory array and the second memory array.

In another example, a memory device may include a memory array having differential bits cells where the tunnel junctions are arranged in multiple columns. For instance, in one particular implementation, the tunnel junctions may be arranged along adjacent source lines. In this particular example, the first column may have a first column selection device and/or a second column selection device between the tunnel junctions of the first column and the shared read circuitry. Similarly, the second column may have a first column selection device and/or a second column selection device between the tunnel junctions of the second column and the shared read circuitry.

In one particular example, the first column may have a first column selection device between the tunnel junctions of the first column and the shared preamplifier circuitry. Similarly, the second column may have a first column selection device between the tunnel junctions of the second column and the shared preamplifier circuitry. In some cases, the first and second columns of tunnel junctions may also share PMOS-follower circuitry. For instance, the first column may have a second column selection device between the tunnel junctions of the first column and the shared read circuitry. Similarly, the second column may have a second column selection device between the tunnel junctions of the second column and the shared read circuitry. Thus, shared preamplifier circuitry and shared PMOS-follower circuitry may be utilized to read each tunnel junction of a differential bit cell.

In some implementations, the one or more of the memory arrays of the memory device may be arranged, such that two or more tunnel junctions may be accessed as part of one operation. For instance, a first group of one or more tunnel junctions may be coupled to a first write driver circuit via a first column selection device at a first end and a second column selection device at a second end. Similarly, a second group of one or more tunnel junctions may be coupled to a second write driver via a third column selection device at a first end and a fourth column selection device at a second end. In some cases, the second and fourth column selection devices may be coupled to each other, such that the first and second write drivers may write values to the tunnel junctions of the first group and the second group in unison. In some cases, the memory array is arranged such that the magnetic tunnel junction of the first group and the second group are written to the same state. In other cases, the memory array is arranged such that the tunnel junctions of the first group and the tunnel junctions of the second group are written to opposite or different states.

In some instances, the memory device may be configured to time-multiplex the operations associated with reading the state of the first tunnel junction and the second tunnel junction associated with each differential bit cell. For example, the preamplifier may be configured to include a storage component for maintaining a voltage and/or current level associated with the state of the first tunnel junction, while a voltage or current associated with the second tunnel junction is sensed. For instance, the shared preamplifier may include one or more transmission gates coupled to one or more capacitors for storing a voltage representative of the state of the first tunnel junction.

In another example, the memory device may include a first memory array arranged adjacent to a second memory array. In this particular example, the first memory array may have write driver circuitry coupled to a first end of the first memory array via a first column selection circuit. The first memory array may be coupled to a second column selection circuit at a second end, opposite the first end. The second column selection circuit may then be coupled to the second memory array via a third column selection circuit at a first end. The second memory array may also be coupled to a second write driver circuit at a second end, opposite the first end, via a fourth column selection circuit.

For instance, in one particular arrangement, each column of tunnel junctions of the first memory array may be coupled to a first column selection device at a first end and a second column selection device at a second end and each column of tunnel junctions of the second memory array may be coupled to a third column selection device at a first end and a fourth column selection device at a second end. The first column selection device may be coupled to a first write driver circuit and the fourth column selection device may be coupled to a second write driver circuit. In some cases, it should be understood that the columns of the first and second memory arrays may include one or more tunnel junctions. Further, in some cases, the columns of tunnel junctions of the first memory array may be coupled to the columns of tunnel junctions of the second memory array, such that each tunnel junction is set to the same state. Alternatively, the columns of tunnel junctions of the first memory array may be coupled to the columns of tunnel junctions of the second memory array, such that each tunnel junction is set to a different state.

FIG. 1 illustrates a diagram of an example memory device 100 incorporating shared read circuitry, such as shared preamplifier circuitry 102 and shared PMOS-follower 104 according to some implementations. In some cases, the preamplifier circuitry 102 and the PMOS-follower 104 are coupled to two or more tunnel junctions, generally indicated by 106 and 108. In the current example, the tunnel junctions 106 and 108 collectively represent a differential bit cell 110. For instance, the differential bit cell 110 may be configured such that when a value of zero is stored, the tunnel junctions 106 is in a high state and the tunnel junction 108 is in a low state. Likewise, the differential bit cell 110 may be configured such that when a value of one is stored, the tunnel junctions 106 is in a low state and the tunnel junction 108 is in a high state. The value stored on the differential bit cell 110 may be read or accessed via a shared read circuitry by sensing the state stored on the tunnel junction 106, storing a voltage or current representative of the sensed state, sensing the state stored on the tunnel junction 108, and comparing the sensed state with the stored state.

In the illustrated example, the preamplifier circuitry 102 may be coupled to the tunnel junction 106 via column selection circuitry 112 and to the tunnel junction 108 via column selection circuitry 114. For example, in the illustrated example, the column selection circuitry 112 includes a column selection device 116 coupled to the tunnel junction 106 at a first electrode and the preamplifier circuitry 102 on a second electrode. The column selection circuitry 114 includes a column selection device 118 coupled to the tunnel junction 108 on a first electrode and the preamplifier circuitry 102 on a second electrode. While the column selection circuitry 112 and the column selection circuitry 114 are illustrated as including a single column selection device 116 and 118, respectively, in some implementations, the column selection circuitry 112 and 114 may each include multiple column selection devices and/or other components for selecting bit lines and source lines associated with bit cells and/or tunnel junctions associated with differential bit cells of a memory arrays being accessed. Additionally, it should be understood that the column selection circuitry 116 and 118 may, in some examples, be incorporated into a single circuit.

In general, the preamplifier circuitry 102 is coupled to comparator and latch components 120 for generating a data signal 146 representative of the value stored on the differential bit cell 110. The comparator and latch components 120 configured to determine the value stored on the differential bit cell 110 by comparing the value sensed from tunnel junction 106 with the value sensed from tunnel junction 108. The comparator and latch components 120 are coupled to a first electrode and a second electrode of a transmission gate 122. The transmission gate 122 also has a first gate to receive a first timing control voltage 124 and a second gate to receive a second timing control voltage 126. The first electrode of the transmission gate 122 is also coupled to a first electrode of a PMOS transistor 128 and a first electrode of a negative-channel metal oxide semiconductor (NMOS) switch transistor 130. The second electrode of the transmission gate 122 is coupled to a first electrode of a capacitor 132 and to a gate of the NMOS switch transistor 130. The capacitor 132 has a second electrode coupled to a reference voltage 134. The PMOS switch transistor 128 also has a second electrode coupled to the reference voltage 134. The NMOS switch transistor 130 also has a gate for receiving a control voltage 136 and a second electrode coupled to a NMOS-follower transistor 138. The NMOS-follower transistor 138 has a gate coupled to a capacitor 140 for receiving a reference voltage 144 and a second electrode coupled to a first electrode of the column selection device 116 and a first electrode of the column selection device 118. The capacitor 140 has a second electrode coupled to a voltage source 144.

In the illustrated example, the second electrode of the NMOS-follower transistor 138 is coupled to the column selection circuitry 112 and the column selection circuitry 114. For instance, the second electrode of the NMOS-follower transistor 138 may be coupled to the first electrode of the column selection device 116 and the first electrode of the column selection device 118. The column selection device 116 also has a gate for receiving a control voltage 148 and a second electrode coupled to a first electrode of the tunnel junction 106. The tunnel junction 106 has a second electrode coupled to a NMOS switch transistor 150. The NMOS switch transistor 150 has a gate for receiving a control voltage 152 (such as a word line voltage) and a second electrode. Similarly, the column selection device 118 has a gate for receiving a control voltage 154 and a second electrode coupled to a first electrode of the tunnel junction 108. The tunnel junction 108 has a second electrode coupled to a NMOS switch transistor 156. The NMOS switch transistor 156 has a gate for receiving a control voltage 158 (such as a word line voltage) and a second electrode. In some cases, the control voltages 152 and 156 may be the same, such as when the tunnel junctions are arranged within the same row of different columns.

In the current example, the PMOS-follower 104 is coupled to column selection circuitry 160 and column selection circuitry 162. For instance, the PMOS-follower 104 may be coupled to the first electrode of a column selection device 164 and a first electrode of a column selection device 166. The column selection device 164 also has a gate for receiving a control voltage 168 and a second electrode coupled to the second electrode of the NMOS switch transistor 150. The column selection device 166 also has a gate for receiving a control voltage 170 and a second electrode coupled to the second electrode of the NMOS switch transistor 156.

In one example, the memory device 100 may be configured to utilize differential bit cells incorporating two tunnel junctions. In some cases, to determine a value stored on the differential bit cell 110, a state associated with each of the tunnel junctions 106 and 108 of the differential bit cell 110 may be compared. In the present example, the preamplifier circuitry 102 may be configured to time-multiplex the sensing operations associated with determining the state of differential bit cell 110 by sensing each of the tunnel junctions 106 and 108. Thus, the preamplifier circuitry 102 may be configured to sense the state associated with both the tunnel junction 106 and the tunnel junction 108 reducing device mismatch and, thereby, reducing the overall size of the preamplifier circuitry.

For example, when a read operation is performed on memory array 100, a state of the tunnel junction 106 is sensed by the preamplifier circuitry 102. Thus, the column selection circuitry 112 and the column selection circuitry 160 are activated. For instance, the column selection device 116 may be enabled by the control voltage 148 and the column selection device 164 may be enabled by the control voltage 168. Additionally, the NMOS switch transistor 150 is activated by the control voltage 152 (such as a word line voltage).

Once the column selection device 116 and the column selection device 164, as well as the NMOS switch transistor 150 are enabled, the preamplifier circuitry 102 applies a first predetermined read voltage 172 based on the second voltage reference 142 to the line selected by the column selection circuitry 112 and associated with the tunnel junction 106. For example, the control voltage 136 may be set to a low state to disable the NMOS switch transistor 130, while the reference voltage 142 is transitioned to a high state to enable the NMOS-follower transistor 138. At the same time, the PMOS-follower 104 provide a second predetermined read voltage 174 to the line selected by the column selection circuitry 164 and associated with the tunnel junction 106. For example, the first predetermined read voltage 172 may be applied to the bit line associated with the tunnel junction 106 by the preamplifier circuitry 102 and the second predetermined read voltage 174 may be applied to the source line associated with the tunnel junction 106.

After applying the first predetermined read voltage 172, the control voltage 136 is transitioned from the first state to a second state (e.g., from a high voltage level to low voltage level). The falling value of the control voltage 136, in part, terminates the application of first predetermined read voltage 172 to the tunnel junction 106, while the PMOS-follower 104 terminates the second predetermined read voltage 174. At substantially the same time, the first timing control voltage 124 and the second timing control voltage 126 cause the transmission gate 122 to isolate the charged capacitor 132, which stores a sample voltage 176 generated based at least in part on the application of the first predetermined read voltage 172 and second predetermined read voltage 174. In this instance, the sample voltage 176 is representative of the state associated with the tunnel junction 106 when biased by the first predetermined read voltages 172 and the second predetermined read voltages 174.

Once the sample voltage 176 representative of the state associated with the tunnel junction 106 is isolated on the capacitor 132, a state of the tunnel junction 108 is sensed by the preamplifier circuitry 102. Thus, the column selection circuitry 112 and the column selection circuitry 160 are deactivated. For instance, the control voltage 148 and the control voltage 168 may be terminated causing the column selection device 116 and the column selection device 164 to disable. Additionally, the control voltage 152 may also terminate or transition to a low voltage level causing the NMOS switch transistor 150 to also deactivate. The column selection circuitry 114 and the column selection circuitry 162 may be enabled. For instance, the column selection device 118 may be enabled by the control voltage 154 and the column selection device 166 may be enabled by the control voltage 170. Similarly, the NMOS switch transistor 156 is activated by the control voltage 158 (such as a word line voltage).

Next, the first predetermined read voltage 172 and the second predetermined read voltage 174 are reinitiated by the preamplifier circuitry 102 and the PMOS-follower 104, as a result of the control voltage 142 transitioning from low voltage levels back to high voltage levels. For example, the preamplifier circuitry 102 applies the first predetermined read voltage 172 to the lines selected by the column selection circuitry 114, while the PMOS-follower circuitry 104 provide the second predetermined read voltage 174 to the lines selected by the column selection circuitry 166 to generate the evaluation voltage 178 representative of the state of the tunnel junction 108.

The comparator and latch components 120 may then sense the difference between sample voltage 176 (e.g., the voltage stored on capacitor 132 and representative of the state of the tunnel junction 106) and evaluation voltage 178 (e.g., the voltages representative of the state of the tunnel junction 108). Based on the difference between the sample voltage 176 and the evaluation voltage 178, the comparator and latch component 120 may output the difference as a digital signal or data 146 representing a value (e.g., zero or one).

As described above, the tunnel junctions 106 and 108 together form the differential bit cell 110. In the illustrated example, only the two tunnel junctions 106 and 108 are shown. However, it should be understood that a memory device may incorporate any number of differential bit cells, each having two tunnel junctions for storing a state associated with the differential bit cell. Additionally, it should be understood that any number of tunnel junctions or arrays of tunnel junctions may be positioned between the column selection devices 116 and 164, as well as between the column selection devices 118 and 166. For instance, an array of tunnel junctions may be arranged in lieu of the tunnel junctions 106 and 108.

Figure 2:
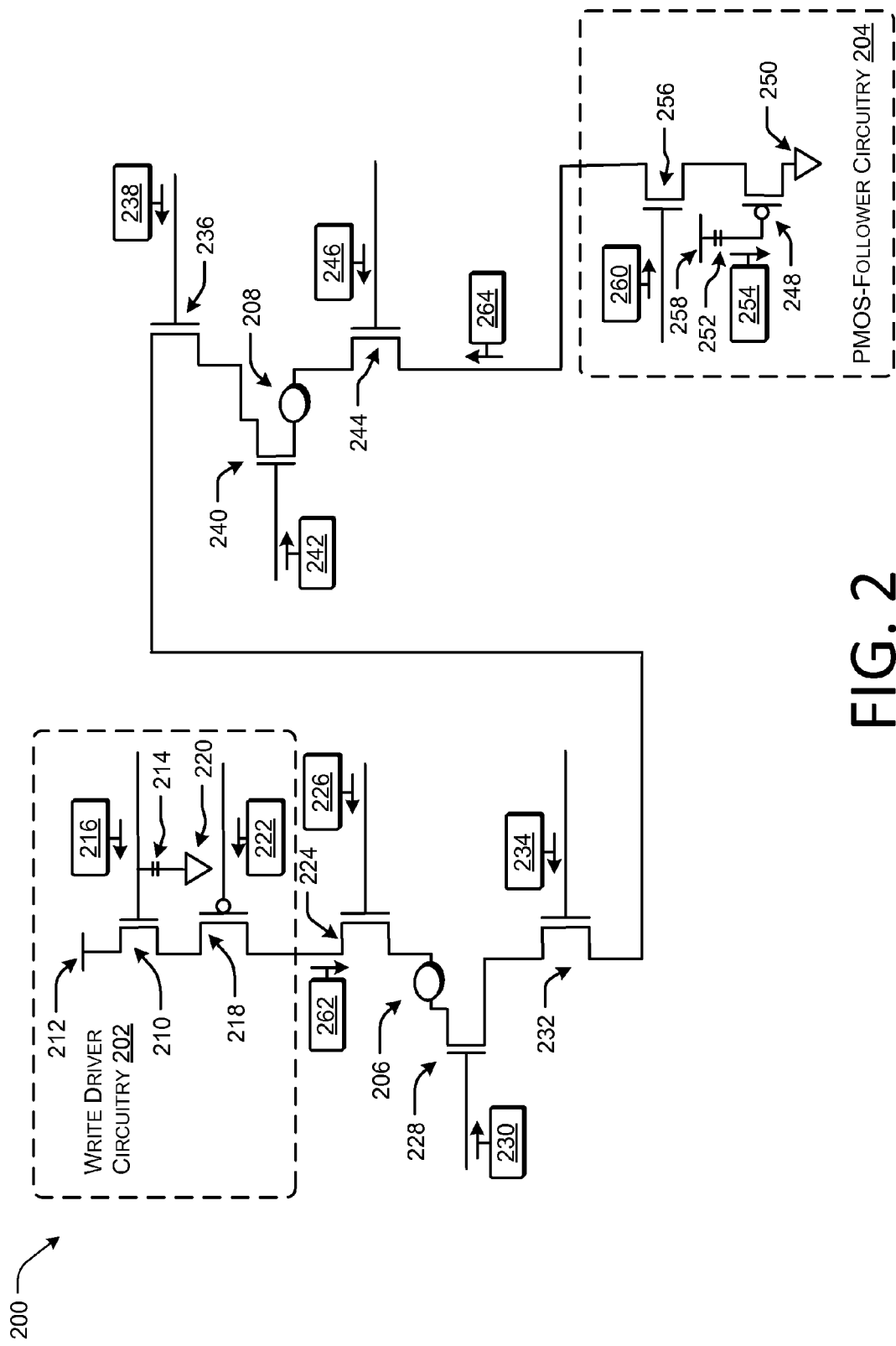
FIG. 2 illustrates a diagram of an example memory device incorporating shared write circuitry according to some implementations.
Figure 3:
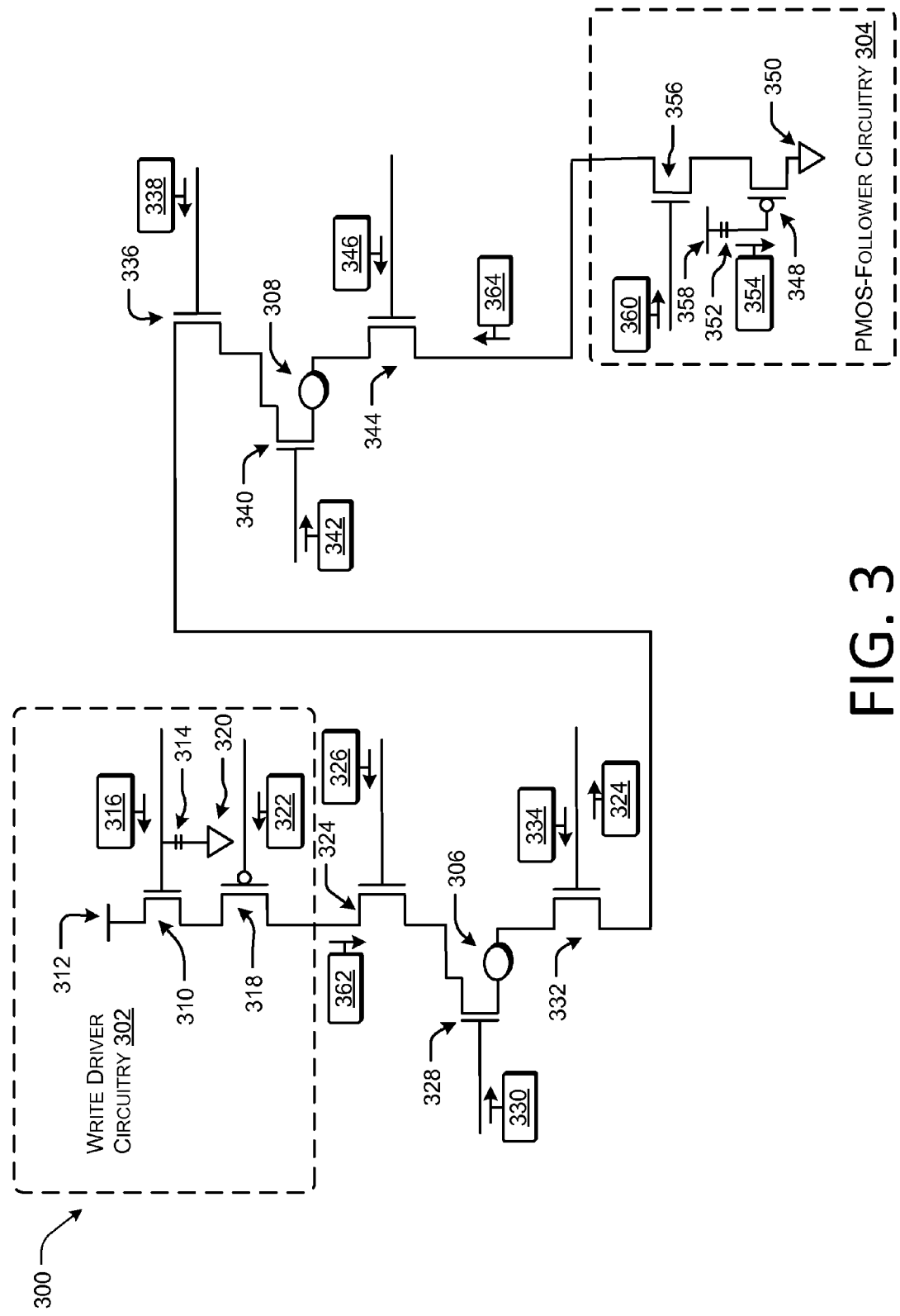
FIG. 3 illustrates another diagram of an example memory device incorporating shared write circuitry according to some implementations.

FIG. 1 illustrates one example implementation in which differential bit cells may utilize shared read circuitry for reducing device mismatch. For instance, in FIG. 1, the tunnel junctions are arranged in different columns of the same array or in separate arrays altogether. FIGS. 2 and 3 illustrate example diagrams of an arrangement of a memory device having bit cells and/or differential bit cells configured to utilize shared write circuitry.

FIG. 2 illustrates a diagram of an example memory device 200 incorporating shared write circuitry, such as write driver circuitry 202 and PMOS-follower circuitry 204, according to some implementations. In the present example, two tunnel junctions 206 and 208 are illustrated. The tunnel junctions 206 and 208 are configured such that when one is written to a high state the other is written to a low state. For instance, in one particular implementation, the tunnel junction 206 and the tunnel junction 208 may together represent a differential bit cell (such as differential bit cell 110 of FIG. 1).

In the illustrated example, the write driver circuitry 202 may include a NMOS-follower transistor 210 having a first electrode coupled to a supply voltage 212, a gate coupled to a first electrode of a capacitor 214 for receiving a reference voltage 216, and a second electrode coupled to a first electrode of a PMOS switch transistor 218. The capacitor 214 includes a second electrode coupled to a power source 220. The PMOS switch transistor 218 also includes a gate for receiving a control voltage 222 and a second electrode coupled to a column selection device 224.

The column selection device 224 may be part of column selection circuitry (such as column selection circuitry 112 and/or 114 of FIG. 1) and includes a gate for receiving a control voltage 226 and a second electrode coupled to a first electrode of the tunnel junction 206. The tunnel junction 206 further includes a second electrode coupled to a NMOS switch transistor 228. The NMOS switch transistor 228 also includes a gate for receiving a control voltage 230 (such as a word line voltage) and a second electrode coupled to a column selection device 232. The column selection device 232 may be part of column selection circuitry (such as column selection circuitry 160 and/or 162 of FIG. 1) and includes a gate for receiving a control voltage 234 and a second electrode coupled to a first electrode of a column selection device 236.

The column selection device 236 may be part of column selection circuitry (such as column selection circuitry 112 and/or 114 of FIG. 1) and includes a gate for receiving a control voltage 238 and a second electrode coupled to a first electrode of a NMOS switch transistor 240. The NMOS switch transistor 240 also includes a gate for receiving a control voltage 242 (such as a word line voltage) and a second electrode coupled to the tunnel junction 208. The tunnel junction 208 further includes a second electrode coupled to a column selection device 244. The column selection device 236 may be part of column selection circuitry (such as column selection circuitry 160 and/or 162 of FIG. 1) and includes a gate for receiving a control voltage 246 and a second electrode coupled to the PMOS-follower circuitry 204. In some case control voltages 230 and 242 may be representative of the same voltage level. In other cases, the voltage levels represented by the control voltages 230 and 242 may differ (for example, the control voltage 230 may be a high voltage and the control voltage 242 may be a low voltage or vice versa). In some implementations, the control voltages 230 and 242 may be generated by one or more charge pumps (not shown).

In the illustrated example, the PMOS-follower circuitry 204 includes a PMOS-follower transistor 248 having a first electrode coupled to a power source 250, a gate coupled to a capacitor 252 for receiving a reference voltage 254, and a second electrode coupled to a first electrode of a NMOS switch transistor 256. The capacitor 252 has a second electrode coupled to a voltage reference 258 which at least in part is responsible for generating the control voltage 254. The NMOS switch transistor 256 has a gate for receiving a control voltage 260 and a second electrode coupled to the second electrode of the column selection device 244.

In an example, the write driver circuitry 202 generates a first predetermined write voltage 262, while the PMOS-follower circuitry 204 generates a second predetermined write voltage 264. For example, the control voltage 220 is driven low to enable the PMOS switch transistor 218 to generate the first predetermined write voltage 262. Similarly, the control voltage 260 may be driven high to enable the NMOS switch transistor 256 to generate the second predetermined write voltage 264. For instance, the PMOS-follower circuitry 204 provides the first predetermined write voltage 264, based on the magnitudes of voltage source 250 and reference voltage 254.

While the first predetermined write voltage 262 and the second predetermined write voltage 264 are being applied, the control voltages 226, 230, 242, and 246 enable the column selection devices 224, 232, 238, and 244, respectively. The first and second predetermined write voltages 262 and 264 drive a voltage over the tunnel junction 206 in a first direction to set the tunnel junction 206 to a first state and drive the voltage over the tunnel junction 208 in a second direction to set the tunnel junction 208 to a second state (e.g., the state opposite the first state). For instance, the voltage may cause the tunnel junction 206 to be set to a high resistive state and the tunnel junction 208 to a low resistive state. In another instance, the voltage may cause the tunnel junction 206 to be set to a low resistive state and the tunnel junction 208 to a high resistive state.

FIG. 3 illustrates another diagram of an example memory device incorporating shared write circuitry, such as write driver circuitry 302 and PMOS-follower circuitry 304, according to some implementations. In the present example, two tunnel junctions 306 and 308 are illustrated. The tunnel junctions 306 and 308 are configured, such that both may be written to a high state or both may be written to a low state (e.g., both tunnel junctions 306 and 308 are set to the same state). For instance, a memory device 300 may utilize non-differential bit cells (e.g., each tunnel junction represents a different bit cell) and may be configured to implement self-referenced reads, which causes each bit cell (or tunnel junction) of a memory array to be written to the low resistive state as part of the operations associated with a read access. For example, in some cases, the self-referenced reads include sensing a state associated with a tunnel junction, storing a voltage representative of the sensed state, performing write operations to set the tunnel junction to a low resistive state, sensing the state associated with the tunnel junction after performing the write operations, and comparing the stored voltage with the sensed voltage.

In the illustrated example, the write driver circuitry 302 may include a NMOS-follower transistor 310 having a first electrode coupled to a supply voltage 312, a gate coupled to a first electrode of a capacitor 314 for receiving a reference voltage 316, and a second electrode coupled to a first electrode of a PMOS switch transistor 318. The capacitor 314 includes a second transistor coupled to a power source 320. The PMOS-follower transistor 318 also includes a gate for receiving a control voltage 322 and a second electrode coupled to a column selection device 324.

The column selection device 324 may be part of column selection circuitry (such as column selection circuitry 112 and/or 114 of FIG. 1) and includes a gate for receiving a control voltage 326 and a second electrode coupled to a NMOS switch transistor 328. The NMOS switch transistor 328 also includes a gate for receiving a control voltage 330 (such as a word line voltage) and a second electrode coupled to a first electrode of the tunnel junction 306. The tunnel junction 306 further includes a second electrode coupled to a first electrode of a column selection device 332. The column selection device 332 may be part of column selection circuitry (such as column selection circuitry 160 and/or 162 of FIG. 1) and includes a gate for receiving a control voltage 334 and a second electrode coupled to a first electrode of a column selection device 336.

The column selection device 336 may be part of column selection circuitry (such as column selection circuitry 112 and/or 114 of FIG. 1) and includes a gate for receiving a control voltage 338 and a second electrode coupled to a first electrode of a NMOS switch transistor 340. The NMOS switch transistor 340 also includes a gate for receiving a control voltage 342 (such as a word line voltage) and a second electrode coupled to the tunnel junction 308. The tunnel junction 308 further includes a second electrode coupled to a column selection device 344. The column selection device 344 may be part of column selection circuitry (such as column selection circuitry 160 and/or 162 of FIG. 1) and includes a gate for receiving a control voltage 346 and a second electrode coupled to the PMOS-follower circuitry 304.

In the illustrated example, the PMOS-follower circuitry 304 includes a PMOS-follower transistor 348 having a first electrode coupled to a power source 350, a gate coupled to a capacitor 352 for receiving a reference voltage 354, and a second electrode coupled to a first electrode of a NMOS switch transistor 356. The capacitor 352 has a second electrode coupled to a voltage reference 358 which at least in part is responsible for generating the control voltage 354. The NMOS switch transistor 356 has a gate for receiving a control voltage 360 and a second electrode coupled to the second electrode of the column selection device 344.

In an example, the write driver circuitry 302 generates a first predetermined write voltage 362, while the PMOS-follower circuitry 304 generates a second predetermined write voltage 364. For example, the control voltage 322 may be driven low to enable the PMOS switch transistor 318 to generate the first predetermined write voltage 362 based on the voltage levels from supply 312 and reference voltage 316. Similarly, the control voltage 360 may be driven high to enable the NMOS switch transistor 356 to generate the second predetermined write voltage 364. For instance, the PMOS-follower circuitry 304 provides the second predetermined write voltage 364, based on the magnitude of voltage source 350 and reference voltage 354.

While the first predetermined write voltage 362 and the second predetermined write voltage 364 is being applied, the control voltages 326, 330, 342, and 346 enable the column selection devices 324, 328, 340, and 344, respectively. The first and second predetermined write voltages 362 and 364 drive a voltage over the tunnel junction 306 in a first direction to set the tunnel junction 306 to a first state and drive the voltage over the tunnel junction 308 in the same direction to set the tunnel junction 308 to a same state (e.g., the first state). For instance, the voltage may set both the tunnel junctions 306 and 308 to a high resistive state or to a low resistive state.

Figure 4:
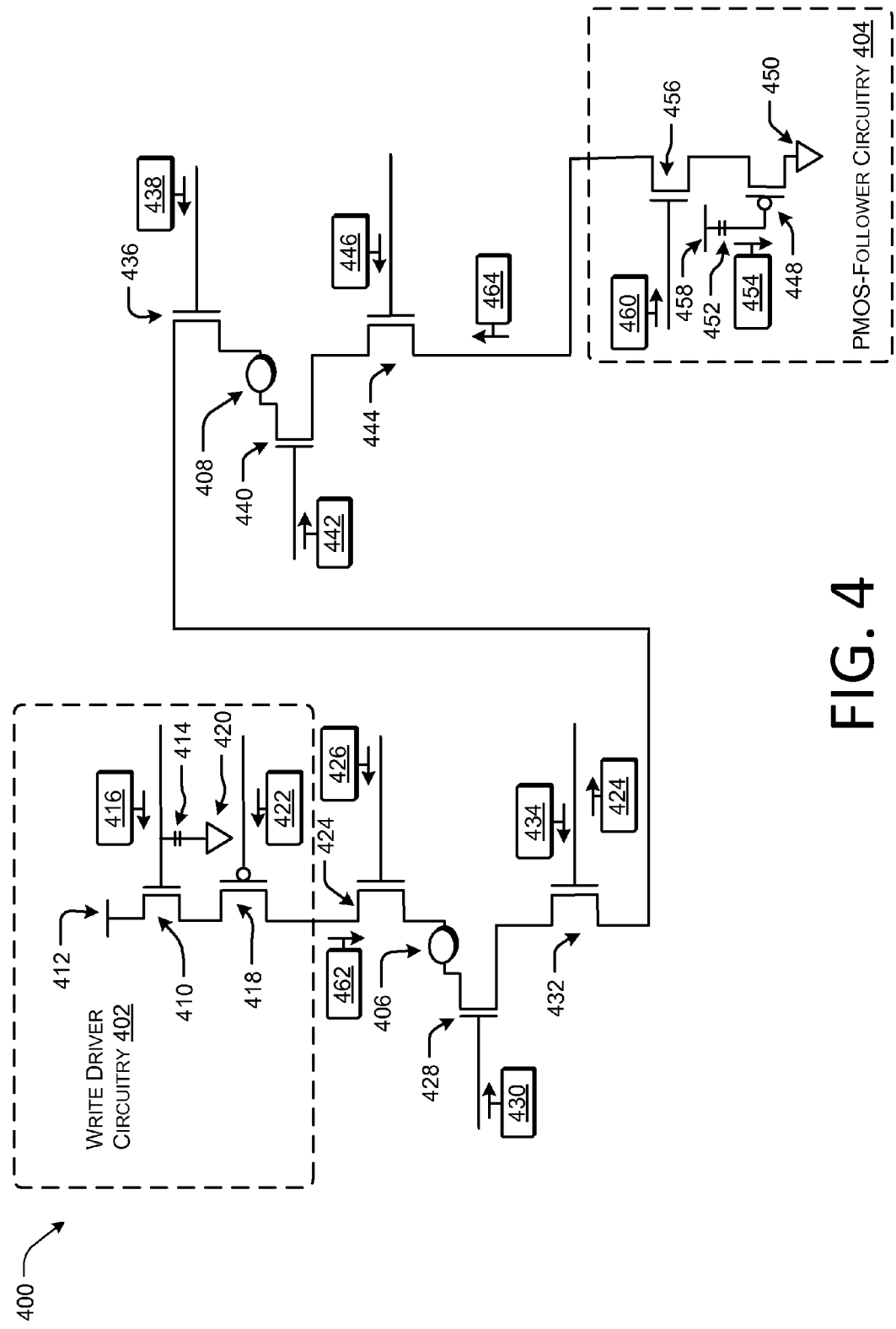
FIG. 4 illustrates another diagram of an example memory device incorporating shared write circuitry according to some implementations.

FIG. 4 illustrates another diagram of an example memory device 400 incorporating shared write circuitry, such as write driver circuitry 402 and PMOS-follower circuitry 404, according to some implementations. In the present example, two tunnel junctions 406 and 408 are illustrated. The tunnel junctions 406 and 408 are configured, such that both may be written to a high state or both may be written to a low state (e.g., both tunnel junctions 406 and 408 are set to the same state). For instance, a memory device 400 may utilize non-differential bit cells (e.g., each tunnel junction represents a different bit cell) and may be configured to implement self-referenced reads, which causes each bit cell (or tunnel junction) of a memory array to be written to the low resistive state as part of the operations associated with a read access. For example, in some cases, the self-referenced reads include sensing a state associated with a tunnel junction, storing a voltage representative of the sensed state, performing write operations to set the tunnel junction to a low resistive state, sensing the state associated with the tunnel junction after performing the write operations, and comparing the stored voltage with the sensed voltage.

In the illustrated example, the write driver circuitry 402 may include a NMOS-follower transistor 410 having a first electrode coupled to a supply voltage 412, a gate coupled to a first electrode of a capacitor 414 for receiving a reference voltage 416, and a second electrode coupled to a first electrode of a PMOS switch transistor 418. The capacitor 414 includes a second transistor coupled to a power source 420. The PMOS-follower transistor 418 also includes a gate for receiving a control voltage 422 and a second electrode coupled to a column selection device 424.

The column selection device 424 may be part of column selection circuitry (such as column selection circuitry 112 and/or 114 of FIG. 1) and includes a gate for receiving a control voltage 426 and a second electrode coupled to a NMOS switch transistor 428. The NMOS switch transistor 428 also includes a gate for receiving a control voltage 430 (such as a word line voltage) and a second electrode coupled to a first electrode of the tunnel junction 406. The tunnel junction 406 further includes a second electrode coupled to a first electrode of a column selection device 432. The column selection device 432 may be part of column selection circuitry (such as column selection circuitry 160 and/or 162 of FIG. 1) and includes a gate for receiving a control voltage 434 and a second electrode coupled to a first electrode of a column selection device 436.

The column selection device 436 may be part of column selection circuitry (such as column selection circuitry 112 and/or 114 of FIG. 1) and includes a gate for receiving a control voltage 438 and a second electrode coupled to a first electrode of a NMOS switch transistor 440. The NMOS switch transistor 440 also includes a gate for receiving a control voltage 442 (such as a word line voltage) and a second electrode coupled to the tunnel junction 408. The tunnel junction 408 further includes a second electrode coupled to a column selection device 444. The column selection device 444 may be part of column selection circuitry (such as column selection circuitry 160 and/or 162 of FIG. 1) and includes a gate for receiving a control voltage 446 and a second electrode coupled to the PMOS-follower circuitry 404.

In the illustrated example, the PMOS-follower circuitry 404 includes a PMOS-follower transistor 448 having a first electrode coupled to a power source 450, a gate coupled to a capacitor 452 for receiving a reference voltage 454, and a second electrode coupled to a first electrode of a NMOS switch transistor 456. The capacitor 452 has a second electrode coupled to a voltage reference 458 which at least in part is responsible for generating the control voltage 454. The NMOS switch transistor 456 has a gate for receiving a control voltage 460 and a second electrode coupled to the second electrode of the column selection device 444.

In an example, the write driver circuitry 402 generates a first predetermined write voltage 462, while the PMOS-follower circuitry 404 generates a second predetermined write voltage 464. For example, the control voltage 422 may be driven low to enable the PMOS switch transistor 418 to generate the first predetermined write voltage 462 based on the voltage levels from supply 412 and reference voltage 416. Similarly, the control voltage 460 may be driven high to enable the NMOS switch transistor 456 to generate the second predetermined write voltage 464. For instance, the PMOS-follower circuitry 404 provides the second predetermined write voltage 464, based on the magnitude of voltage source 450 and reference voltage 454.

While the first predetermined write voltage 462 and the second predetermined write voltage 464 is being applied, the control voltages 426, 430, 442, and 446 enable the column selection devices 424, 428, 440, and 444, respectively. The first and second predetermined write voltages 462 and 464 drive a voltage over the tunnel junction 306 in a first direction to set the tunnel junction 406 to a first state and drive the voltage over the tunnel junction 408 in the same direction to set the tunnel junction 408 to a same state (e.g., the first state). For instance, the voltage may set both the tunnel junctions 406 and 408 to a high resistive state or to a low resistive state.

Figure 5:
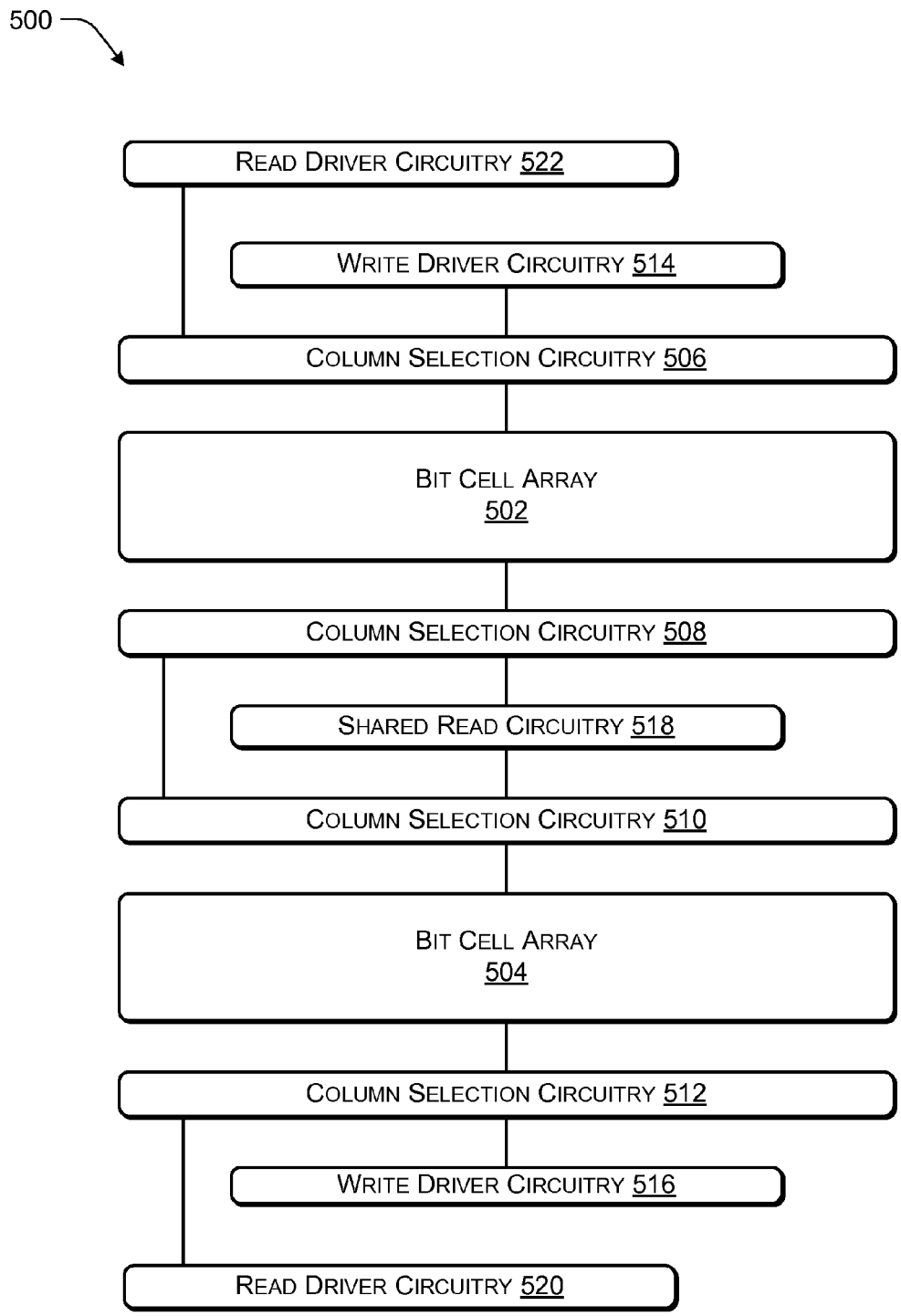
FIG. 5 illustrates an example architecture including select components of a memory device according to some implementations.

FIG. 5 illustrates an example architecture including select components of a memory device 500 according to some implementations. The memory device 500 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processor.

The memory device 500 includes bit cell array 502 and bit cell array 504. In the illustrated example, column selection circuitry 506 may be arranged at one end (e.g., the top) of the bit cell array 502 and column selection circuitry 508 may be arranged at the other end (e.g., the bottom) of the bit cell array 502. The column selection circuitry 510 may be arranged at one end (e.g., the top) of the bit cell array 504 and column selection circuitry 512 may be arranged at the other end (e.g., the bottom) of the bit cell array 504. In the present example, write driver circuitry 514 may be coupled the column selection circuitry 506 and write driver circuitry 516 may be coupled to the column selection circuitry 512. Additionally, shared read circuitry 518 may be coupled to both the column selection circuitry 508 and the column selection circuitry 510. For example, in some implementations, the share read circuitry 518 may be the shared preamplifier circuitry 102 of FIG. 1.

In the illustrated example, the column selection circuitry 508 may also be coupled to the column selection circuitry 510. For example, in one implementation, the write driver circuitry 514 may represent the write driver circuitry 202 of FIG. 2 and the write driver circuitry 516 may represent the PMOS-follower circuitry 204 of FIG. 2. In an alternative example, the write driver circuitry 516 may represent the write driver circuitry 202 of FIG. 2 and the write driver circuitry 514 may represent the PMOS-follower circuitry 204 of FIG. 2. Similarly, the write driver circuitry 514 may represent the write driver circuitry 302 of FIG. 3 and the write driver circuitry 516 may represent the PMOS-follower circuitry 304 of FIG. 3. In an alternative example, the write driver circuitry 516 may represent the write driver circuitry 302 of FIG. 3 and the write driver circuitry 514 may represent the PMOS-follower circuitry 304 of FIG. 3.

Thus, in some examples, a read operation may be performed by the memory device 500 on a differential bit cell having a first tunnel junction associated with the first bit cell array 502 and a second tunnel junction associated with the second bit cell array 504. In this example, first, a state of the first tunnel junction of a bit cell within the bit cell array 502 is sensed by the shared read circuitry 518. Thus, the column selection circuitry 508 and the column selection circuitry 506 are activated to cause a first and second read voltage to be applied over the first tunnel junction, while word line circuitry (not shown) drives a bias voltage over a particular word line or row of the bit cell array 502. For example, the read circuitry 518 may apply the first read voltage over a bit line associated with the first tunnel junction, while read driver circuitry 522 (such as PMOS-follower circuitry) applies the second read voltage to a source line associated with the first tunnel junction. When the word line, the source line, and the bit line of the first tunnel junction are activated, the first tunnel junction generates a voltage level representative of a current state of the first tunnel junction, which may be detected and stored by the read circuitry 518.

Once the voltage level representative of the state of the first tunnel junction of bit cell array 502 is stored by the read circuitry 518, a state of the second tunnel junction of the bit cell within the bit cell array 504 is sensed by the shared read circuitry 518. Thus, the column selection circuitry 510 and the column selection circuitry 512 are activated to cause the first and second read voltage to be applied over the second tunnel junction while the word line circuitry (not shown) drives a bias voltage over a particular word line or row of the bit cell array 504. For example, the read circuitry 518 may apply the first read voltage over a bit line associated with the second tunnel junction while the read driver circuitry 520 (such as PMOS-follower circuitry) applies the second read voltage to a source line associated with the second tunnel junction. When the word line, the source line, and the bit line of the second tunnel junction are activated, the second tunnel junction generates a voltage level representative of a current state of the second tunnel junction, which may be detected by the read circuitry 518. The read circuitry 518 may then compare the stored voltage level with the voltage level representative of the state of the second tunnel junction being detected to determine a value associated with the differential bit cell.

In another example, the bit cell arrays 502 and 504 may be configured to use bit cells having a single tunnel junction. In this example, the single tunnel junction may generate a voltage level when biased that may be evaluated or compared to a reference voltage to determine the value stored on the corresponding bit cell when the bit cell is read. For instance, during a read operation on a bit cell including a single tunnel junction, the first read voltage and the second read voltage may be applied as described above. While the first and second read voltages are applied, a word line circuitry (not shown) drives a bias voltage over a particular word line or row of the bit cell of bit cell array 502 or the bit cell array 504 being accessed. Once the first read voltage, the second read voltage, and the bias voltage are applied to the appropriate tunnel junction, the tunnel junction generates a voltage level representative of a current state which may be detected by the shared read circuitry 518.

In this example, the shared read circuitry 518 may include a reference voltage that may be compared to the voltage level representative of the state of the tunnel junction sensed by the shared read circuitry 518 to determine the value associated with the bit cell. In the present example, it should be understood that the shared read circuitry 518 may sense a voltage level of tunnel junctions (or in this case, bit cells) of either bit cell array 502 or the bit cell array 504 depending on bit cells activated by the column selection circuitry 508 and/or the column selection circuitry 510.

In yet another example, a write operation may be performed by the memory device 500 to write two or more tunnel junctions or bit cells to opposite states. For instance, the memory device 500 may implement differential bit cells having a first tunnel junction associated with the first bit cell array 502 and a second tunnel junction associated with the second bit cell array 504. Thus, the tunnel junctions associated with the differential bit cells are written to opposite states during the write operation, such as the circuit illustrated of FIG. 2.

In the current example, the write driver circuitry 514 may generate a first predetermined write voltage, while the write driver circuitry 516 generates a second predetermined write voltage. While the first predetermined write voltage and the second predetermined write voltage are applied, the column selection circuitry 506, 508, 510, and 512 may activate column selection devices to direct the first and second predetermined write voltages to the first tunnel junction of the differential bit cell (e.g., a tunnel junction within the bit cell array 502) and a second tunnel junction of the differential bit cell (e.g., a tunnel junction within the bit cell array 504). In the current example, the first and second tunnel junctions may be arranged such that the first and second predetermined write voltages drive a voltage over the first tunnel junction in a first direction to set the first tunnel junction to a first state and drive the voltage over the second tunnel junction in a second direction to set the second tunnel junction to a second state (e.g., the state opposite the first state). For instance, the voltage may cause the first tunnel junction to be set to a high resistive state and the second tunnel junction to a low resistive state. In another instance, the voltage may cause the first tunnel junction to be set to a low resistive state and the second tunnel junction to a high resistive state.

In an alternative example, a write operation may be performed by the memory device 500 to write two or more tunnel junctions or bit cells to the same state. For instance, the memory device 500 may implement self-referenced reads, which causes each bit cell (or tunnel junction) of the bit cell array 502 and/or 504 to be written to the low resistive state as part of the operations associated with a read access. Thus, in the present example, the write operation may be performed as part of a read access and configured to cause each of the tunnel junctions of the bit cell arrays 502 and 504 to be written to a low resistive state as part of a single operation.

In the current example, the write driver circuitry 514 may generate a first predetermined write voltage, while the write driver circuitry 516 generates a second predetermined write voltage. While the first predetermined write voltage and the second predetermined write voltage are applied, the column selection circuitry 506, 508, 510, and 512 may activate column selection devices to direct the first and second predetermined write voltages to at least one tunnel junction of the bit cell array 502 and at least one tunnel junction of the bit cell array 504. In the current example, the selected tunnel junctions may be arranged such that the first and second predetermined write voltages drive a voltage over the each of the tunnel junctions in one direction to set the each of the tunnel junctions to a first state (e.g., in this example, to the low resistive state). However, in other instances, the write driver circuitry 514 and 516 may drive the voltage over the each of the tunnel junctions in the other direction to set the each of the tunnel junctions to a second state (e.g., the high resistive state).

Figure 6:
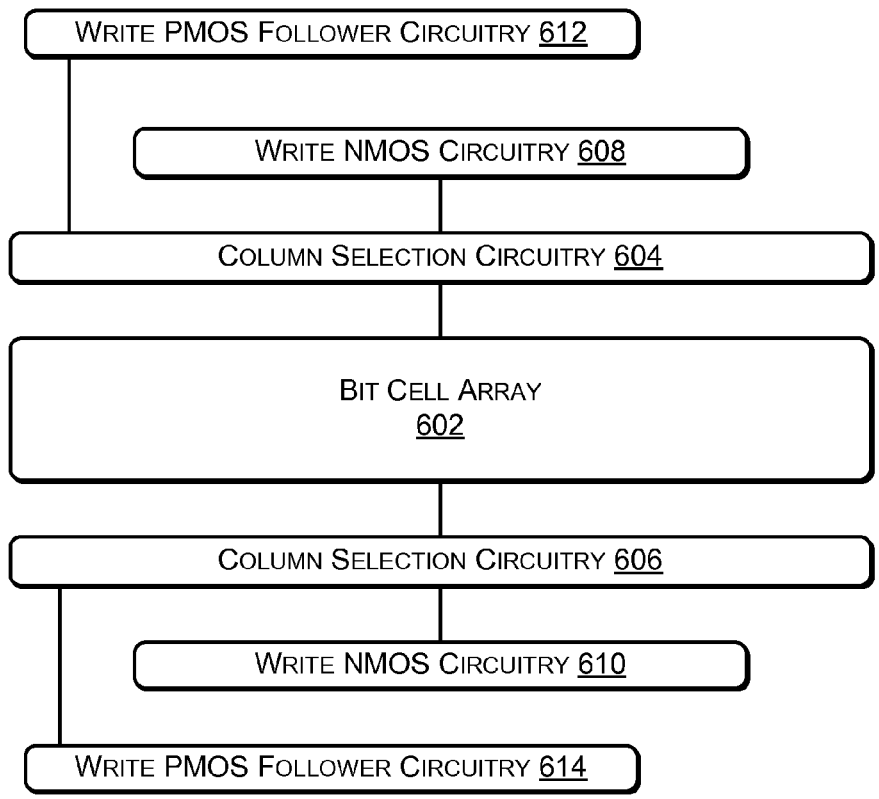
FIG. 6 illustrates an example architecture including select components of a memory device according to some implementations.

FIG. 5 illustrates one example architecture for reading/writing two or more bit cells of different arrays according to some implementations. FIG. 6 below illustrates one example architecture for writing two bit cells of the same array according to some implementations.

FIG. 6 illustrates an example architecture including select components of a memory device 600 according to some implementations. The memory device 600 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processor.

The memory device 600 includes bit cell array 602. In the illustrated example, column selection circuitry 604 may be arranged at one end (e.g., the top) of the bit cell array 602 and column selection circuitry 606 may be arranged at the other end (e.g., the bottom) of the bit cell array 602. In the present example, write NMOS-follower circuitry 608 may be coupled the column selection circuitry 604. In some examples, described herein, the write NMOS-follower circuitry 608 may correspond to write driver circuitry 302 of FIG. 3 and/or write driver circuitry 402 of FIG. 4. For example, in one implementation, two bit cells of the bit cell array 602 may be configured to be written to the same state and the NMOS-follower circuitry 608 may correspond to the write driver circuitry 302 of FIG. 2. In other implementations, two bit cells of the bit cell array 602 may be configured to be written to opposite states and the write NMOS-follower circuitry 608 may correspond to the write driver circuitry 402 of FIG. 4.

The memory device 600 also includes write NMOS-follower circuitry 610, which may be coupled the column selection circuitry 606. In some examples, described herein, the write NMOS-follower circuitry 610 may correspond to write driver circuitry 302 of FIG. 3 and/or write driver circuitry 402 of FIG. 4. For example, in one implementation, two bit cells of the bit cell array 602 may be configured to be written to the same state and the write NMOS-follower circuitry 610 may correspond to the write driver circuitry 302 of FIG. 2, while in other implementations, two bit cells of the bit cell array 602 may be configured to be written to opposite states and the write NMOS-follower circuitry 610 may correspond to the write driver circuitry 402 of FIG. 4.

The memory device 600 also includes write PMOS-follower circuitry 612, which may be coupled the column selection circuitry 606. In some examples, described herein, the write PMOS-follower circuitry 612 may correspond to PMOS-follower circuitry 304 of FIG. 3 and/or PMOS-follower circuitry 404 of FIG. 4. For example, in one implementation, two bit cells of the bit cell array 602 may be configured to be written to the same state and the write PMOS-follower circuitry 612 may correspond to the PMOS-follower circuitry 204 of FIG. 2. In other implementations, two bit cells of the bit cell array 602 may be configured to be written to opposite states and the write PMOS-follower circuitry 612 may correspond to the PMOS-follower circuitry 302 of FIG. 3.

The memory device 600 also includes write PMOS-follower circuitry 614, which may be coupled the column selection circuitry 606. In some examples described herein, the write PMOS-follower circuitry 614 may correspond to PMOS-follower circuitry 204 of FIG. 2 and/or PMOS-follower circuitry 304 of FIG. 3. For example, in one implementation, two bit cells of the bit cell array 602 may be configured to be written to the same state and the write PMOS-follower circuitry 612 may correspond to the PMOS-follower circuitry 302 of FIG. 2. In other implementations, two bit cells of the bit cell array 602 may be configured to be written to opposite states and the write PMOS-follower circuitry 612 may correspond to the PMOS-follower circuitry 302 of FIG. 3.

In the illustrated implementation, by including write NMOS-follower circuitry 608 associated with one end of the bit cell array 602 and write NMOS-follower circuitry 610 associated with the opposite end of the bit cell array 602, the NMOS-follower circuitry 608 and 610 may be utilized to set the two bit cells to either the high or low states, for instance, when setting both bit cells. Similarly, by including write PMOS-follower circuitry 612 associated with one end of the bit cell array 602 and write PMOS-follower circuitry 614 associated with the opposite end of the bit cell array 602, the PMOS-follower circuitry 612 and 614 may be utilized to set the two bit cells to either the high or low states. By accessing each bit cell from two opposite ends of the bit cell array 602, metal routing resistance in the bit cell array may be reduced.

In one example, a write operation may be performed by the memory device 600 to write two or more tunnel junctions or bit cells to opposite states. For instance, the memory device 600 may implement differential bit cells having a two tunnel junction that jointly represent the value stored on the differential bit cell. In these cases, the tunnel junctions associated with the differential bit cells are written to opposite states during the write operation which may be compared during a read operation to determine the stored value.

In the current example, the column selection circuitry 604 and 606 may activate column selection devices to select the first tunnel junction of the differential bit cell and the second tunnel junction of the differential bit cell. The write PMOS-follower circuitry 612 may generate a first predetermined write voltage, while the write NMOS-follower circuitry 610 generates a second predetermined write voltage to drive a bias voltage over the first and second tunnel junctions in a first direction. In the current example, the first and second tunnel junctions may be arranged such that when the bias voltage may be driven in the first direction, the first tunnel junction may be set to a high resistive state and the second tunnel junction may be set to a low resistive state.

Alternatively, the write PMOS-follower circuitry 614 may generate a first predetermined write voltage, while the write NMOS-follower circuitry 608 may generate a second predetermined write voltage to drive a bias voltage over the first and second tunnel junctions in a second direction. In this example, the first and second tunnel junctions may be arranged such that when the bias voltage may be driven in the second direction, the first tunnel junction may be set to a low resistive state and the second tunnel junction may be set to a high resistive state. Thus, by arranging a write PMOS-follower circuit and an NMOS-follower circuit at both ends of the bit cell array 602, the memory device 600 may drive bias voltages over the tunnel junctions of the bit cells of the bit cell array 602 in either direction (e.g., from the top to the bottom or from the bottom to the top).

In another example, a write operation may be performed by the memory device 600 to write two or more tunnel junctions or bit cells of the bit cell array 602 to the same state. For instance, the memory device 600 may implement self-referenced reads, which causes each bit cell (or tunnel junction) of the bit cell array 602 to be written to the low resistive state as part of the operations associated with a read access to the array 602. Thus, in the present example, the write operation may be performed as part of a read access and configured to cause each of the tunnel junctions of the bit cell array 602 to be written to a low resistive state as part of a single operation.

In the current example, the write PMOS-follower circuitry 614 may generate a first predetermined write voltage, while the NMOS-follower circuitry 608 generates a second predetermined write voltage. The column selection circuitry 604 and 606 may activate column selection devices to direct the first and second predetermined write voltages to two or more tunnel junction of the bit cell array 602 (such as each tunnel junction associated with a column of the bit cell array 602). In the current example, the selected tunnel junctions may be arranged such that the first and second predetermined write voltages drive a voltage over the each of the tunnel junctions in one direction to set each of the tunnel junctions to a first state (e.g., in this example, to the low resistive state).

However, in other instances, the memory device 600 may be configured to place each of the tunnel junctions selected by the column selection circuitry 604 and 606 to a high resistive state. In this instance, the write PMOS-follower circuitry 612 may generate the first predetermined write voltage, while the NMOS-follower circuitry 610 generates the second predetermined write voltage to drive a bias voltage over the selected tunnel junctions in a second direction. Thus, the bias voltage, in this instance, sets each of the selected tunnel junctions into a high resistive state.

Figure 7:
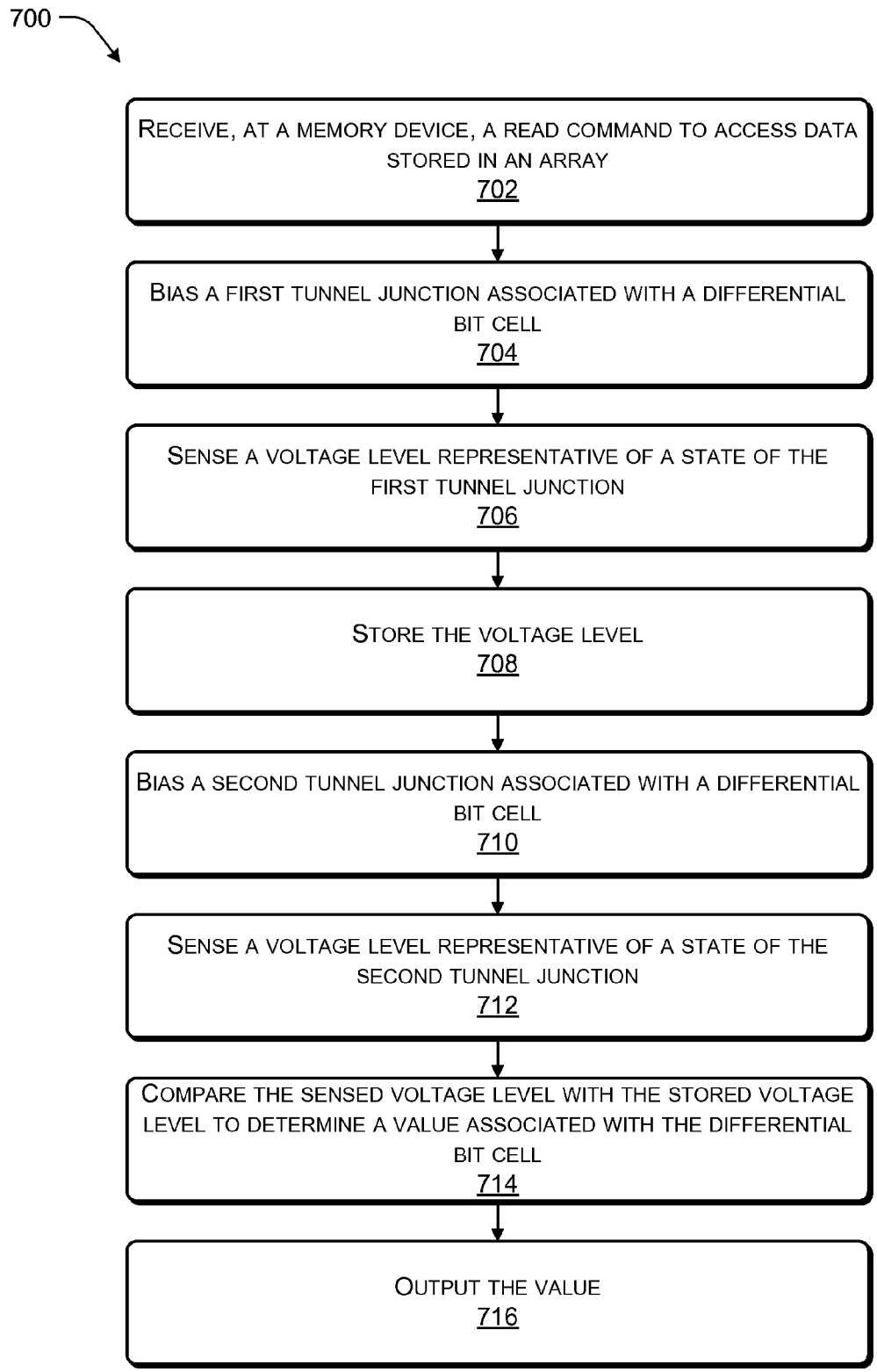
FIG. 7 illustrates an example flow diagram showing an illustrative process for time multiplexing operations associated with sensing a value on a differential bit cell corresponding to a read command according to some implementations.

FIG. 7 illustrates an example flow diagram showing an illustrative process 700 for time-multiplexing operations associated with sensing a value on a differential bit cell corresponding to a read command according to some implementations. For example, as discussed above, in some cases, reducing the size of a memory device may be achieved by reducing the number of circuits or components utilized to read and write the bit cells of the memory arrays. Additionally, in some cases, memory devices are configured with differential bit cells, utilize two different sense amplifier, one to sense the state of the first tunnel junction of the differential bit cell and the other to sense the state of the second tunnel junction of the differential bit cell. However, when different preamplifiers (or sense amplifiers) are utilized to read each the tunnel junctions, some degree of device mismatch occurs. Typically, the device mismatch may be overcome by increasing the area of transistors which in turn results in utilizing larger sense amplifiers and increased power consumption over non-differential bit cell memory devices. Therefore, reducing the mismatch associated with the preamplifiers may result in reduced power consumption of the memory device.

The memory device described herein, may be configured such that each tunnel junction of a differential bit cell may share a sense amplifier and/or other read circuitry by time-multiplex the operations associated with sensing a state of each of the tunnel junctions. For example, the shared preamplifier may be configured to include a storage device for storing a voltage and/or current associated with the state of the first tunnel junction, while a voltage or current associated with the second tunnel junction is read. In one case, the shared preamplifier may include one or more transmission gates coupled to one or more capacitors for storing a voltage associated with the state of the first tunnel junction.

At 702, the memory device receives a read command form an external source to access data stored in an array. In some cases, the read command may be associated with accessing data stored in one or more differential bit cells. For example, as described above, a first and second tunnel junction of the differential bit cell may be on one or more rows of a bit cell array, stored in different columns of a bit cell array, or stored in two different bit cells arrays.

At 704, the memory device biases the first tunnel junction associated the differential bit cell. For example, the first tunnel junction may be selected by activating particular column selection devices and disabling other column selection devices as described above with respect to FIGS. 1 and 2. A shared preamplifier circuit may then generate a first write voltages and a shared PMOS-follower circuit may generate a second write voltages. A word line voltage may then be applied to the row associated with the tunnel junction to allow the first and second write voltages to bias the tunnel junction.

At 706, the preamplifier circuit senses a voltages level representative of a state associated with the first tunnel junction. For example, the voltages level may represent a high resistive state or a low resistive state of the first tunnel junction. However, to determine the state, the voltage level may be compared to a voltage level representative of a state of the second tunnel junction.

At 708, the preamplifier circuit stores the voltage level representative of the state associated with the first tunnel junction. For example, the voltage level may be stored using a transmission gate to isolate the voltage level on a capacitor coupled to a reference voltage. In other examples, the voltage level may be stored using a current mirror or other circuit for isolating a voltage or current.

At 710, the memory device biases the second tunnel junction associated the differential bit cell. For example, the second tunnel junction may be selected by activating particular column selection devices and disabling other column selection devices as described above with respect to FIGS. 1 and 2. The shared preamplifier circuit may then generate a first write voltage and a shared PMOS-follower circuit may generate a second write voltage. A word line voltage may then be applied to the row associated with the second tunnel junction to allow the first and second write voltages to bias the second tunnel junction. In an alternate implementation, at 710, the preamplifier circuit may bias a resistor of a predetermined value instead of the second tunnel junction. The resistance value of the resistor may be selected based at least in part on the parallel resistance of a high and low state tunnel junctions.

At 712, the preamplifier circuit senses a voltage level representative of the state associated with the second tunnel junction. For example, the voltage level may represent a high resistive state or a low resistive state of the second tunnel junction, however, to determine the state the voltage level may be compared to a voltage level representative of a state of the first tunnel junction.

At 714, the memory device compares the sensed voltage level representative of the state associated with the second tunnel junction with the stored voltage level representative of the state associated with the first tunnel junction to determine a value associated with the differential bit cell. For example, the preamplifier circuit may provide the stored voltage level and the sensed voltage level to a comparator and latch component that may compare the two voltage levels and, based on the difference, determine a value associated with the differential bit cell.

At 716, the memory device outputs the value associated with the differential bit cell to the external source. For example, the memory device may provide the value in a temporary memory or cache accessible by the external source. In one particular example, once the value associated with each differential bit cell of the array being accessed is determined, the memory device may provide the data in pages to a cache for access by the external source.

Although the subject matter has been described in language specific to structural features, it may be to be understood that the subject matter defined in the appended claims may be not necessarily limited to the specific features described. For example, in alternate embodiments, source lines associated with a selected column of bit cells may comprise of a plurality of other bit cells and their bit lines on the selected row. Rather, the specific features are disclosed as illustrative forms of implementing the claims.

What is claimed is:
1. A memory device comprising:
   a first bit cell, the first bit cell including a first tunnel junction and a first MOS-switch transistor coupled to a second end of the first tunnel junction;
   a second bit cell, the second bit cell including a second tunnel junction and a second MOS-switch transistor coupled to a first end of the second tunnel junction and a second end of the first tunnel junction;
   write driver circuitry coupled to a first end of the first tunnel junction; and
   PMOS-follower circuitry coupled to a second end of the second tunnel junction.
2. The memory device as recited in claim 1, further comprising:
   a first column selection device coupled between the write driver circuitry and the first tunnel junction;
   a second column selection device coupled between the first NMOS switch transistor and the second NMOS switch transistor;
   a third column selection device coupled between the second column selection device and the second NMOS switch transistor; and
   a fourth column selection device coupled between the second bit cell and the PMOS-follower circuitry.
3. The memory device as recited in claim 1, wherein the first bit cell is associated with a first column of a bit cell array and the second bit cell is associated with a second column of the bit cell array.
4. The memory device as recited in claim 1, wherein the first bit cell is associated with a first bit cell array and the second bit cell is associated with a second bit cell array.
5. The memory device as recited in claim 1, wherein the first bit cell and the second bit cell represent a differential bit cell.
6. The memory device as recited in claim 1, wherein the write driver circuity includes NMOS-follower circuitry.
7. A memory device comprising:
   a first bit cell, the first bit cell including a first tunnel junction coupled to a first NMOS switch transistor;
   a second bit cell, the second bit cell including a second tunnel junction coupled to a second NMOS switch transistor, the second NMOS switch transistor coupled to the first tunnel junction;
   write driver circuitry coupled to the first NMOS switch transistor; and

PMOS-follower circuitry coupled to the second tunnel junction.

8. The memory device as recited in claim 7, further comprising:
a first column selection device coupled between the write driver circuitry and the first NMOS switch transistor;
a second column selection device coupled between the first tunnel junction and the second NMOS switch transistor;
a third column selection device coupled between the second column selection device and the second NMOS switch transistor; and
a fourth column selection device coupled between the second bit cell and the PMOS-follower circuitry.

9. The memory device as recited in claim 7, wherein the first bit cell is associated with a first column of a bit cell array and the second bit cell is associated with a second column of the bit cell array.

10. The memory device as recited in claim 7, wherein the first bit cell is associated with a first bit cell array and the second bit cell is associated with a second bit cell array.

11. The memory device as recited in claim 7, further comprising
a third bit cell, the third bit cell including a third tunnel junction coupled to a third NMOS switch transistor, the third NMOS switch transistor coupled to the second tunnel junction; and
wherein the PMOS-follower circuitry is coupled to the third tunnel junction.

12. The memory device as recited in claim 7, wherein the first NMOS switch transistor and the second NMOS switch transistor are configured to enable in response to a same word line voltage.

13. A memory device comprising:
a first bit cell array;
first write driver circuitry coupled to a first end of the first bit cell array, the first write driver to generate a first write voltage;
a second bit cell array, a first end of the second bit cell array coupled to a second end of the first bit cell array; and
second write driver circuitry coupled to a second end of the second bit cell array, the second write driver to generate a second write voltage, wherein the first write voltage and the second write voltage are driven over a bit cell of the first bit cell array and a bit cell of the second bit cell array during a write operation.

14. The memory device as recited in claim 13, further comprising:
first column selection circuitry coupled between the first write driver circuitry and the first bit cell array;
second column selection circuitry coupled between the first bit cell array and the second bit cell array;
third column selection circuitry coupled between the second column selection circuitry and the second bit cell array; and
fourth column selection circuitry coupled between the second write driver circuitry and the second bit cell array.

15. The memory device as recited in claim 13, wherein:
the first bit cell array includes a first plurality of bit cells, each bit cell of the first plurality of bit cells including at least one tunnel junction; and
the second bit cell array includes a second plurality of bit cells, each bit cell of the second plurality of bit cells including at least one tunnel junction.

16. The memory device as recited in claim 13, further comprising:
first read driver circuitry coupled to a first end of the first bit cell array, the first read driver to generate a first read voltage to bias the bit cells of the first bit cell array; and
second read driver circuitry coupled to a second end of the second bit cell array, the second read driver to generate a second read voltage to bias the bit cells of the second bit cell array.

17. The memory device as recited in claim 13, further comprising shared read circuitry coupled to a second end of the first bit cell array and to a first end of the second bit cell array, the shared read circuitry to sense a voltage associated with at least one bit cell of the first bit cell array or at least one bit cell of the second bit cell array.

18. The memory device as recited in claim 13, wherein the first write voltage and the second write voltage cause the bit cell of the first bit cell array and the bit cell of the second bit cell array to be driven to a similar resistive state.

19. The memory device as recited in claim 13, wherein the first write voltage and the second write voltage cause the bit cell of the first bit cell array and the bit cell of the second bit cell array to be driven to opposite resistive states.

20. The memory device as recited in claim 19, wherein the bit cell of the first bit cell array and the bit cell of the second bit cell array represent a differential bit cell.

* * * * *